United States Patent
Li et al.

(10) Patent No.: US 11,991,841 B2
(45) Date of Patent: May 21, 2024

(54) SPLICING DISPLAY SCREEN AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Dengqian Li, Shenzhen (CN); Rong Xia, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 424 days.

(21) Appl. No.: 17/298,526

(22) PCT Filed: Apr. 30, 2021

(86) PCT No.: PCT/CN2021/091272
§ 371 (c)(1),
(2) Date: May 28, 2021

(87) PCT Pub. No.: WO2022/217662
PCT Pub. Date: Oct. 20, 2022

(65) Prior Publication Data
US 2023/0300994 A1 Sep. 21, 2023

(30) Foreign Application Priority Data
Apr. 16, 2021 (CN) .......................... 202110408930.0

(51) Int. Cl.
*H05K 5/00* (2006.01)
*C09J 201/00* (2006.01)

(52) U.S. Cl.
CPC .......... *H05K 5/0021* (2013.01); *C09J 201/00* (2013.01)

(58) Field of Classification Search
CPC ........................... H05K 5/0021; C09J 201/00
(Continued)

(56) References Cited

U.S. PATENT DOCUMENTS

| 6,573,957 B1* | 6/2003 | Suzuki | G02F 1/13336 349/110 |
| 6,624,570 B1* | 9/2003 | Nishio | H05B 33/14 428/917 |

(Continued)

FOREIGN PATENT DOCUMENTS

| CN | 105093628 A | 11/2015 |
| CN | 107180600 A | 9/2017 |

(Continued)

OTHER PUBLICATIONS

Name of the author: Lu Guang-yi Title of the article: Large-Screen Splicing Technology and its Applications Title of the item: «Computer Knowledge and Technology» Date: Jul. 31, 2009 pp. P.5827-P.5829.

(Continued)

*Primary Examiner* — Binh B Tran
(74) *Attorney, Agent, or Firm* — PV IP PC; Wei Te Chung; Zhigang Ma

(57) ABSTRACT

The present application provides a splicing display screen and a manufacturing method thereof. The splicing display screen includes a backplate. In the present application, a plurality of sub-display panels disposed on the backplate, an adhesive layer disposed between the backplate and the sub-display panels, and a plurality of first sub-surfaces configured to display images in the sub-display panels are arranged on a same plane. The adhesive layer at least (Continued)

corresponds to a gap between every two adjacent sub-display panels to connect every two adjacent sub-display panels.

11 Claims, 5 Drawing Sheets

(58) Field of Classification Search
USPC .......................................................... 361/730
See application file for complete search history.

(56) References Cited

U.S. PATENT DOCUMENTS

| | | | | |
|---|---|---|---|---|
| 6,927,908 | B2 * | 8/2005 | Stark | ................... G02F 1/13336 |
| | | | | 345/1.3 |
| 10,546,516 | B2 * | 1/2020 | Tomoda | ............... G09G 3/3208 |
| 2007/0001579 | A1 | 1/2007 | Jeon et al. | |
| 2013/0280488 | A1 | 10/2013 | Flinn | |
| 2015/0355391 | A1 | 12/2015 | Zhang et al. | |
| 2018/0052312 | A1 | 2/2018 | Jia et al. | |
| 2019/0191574 | A1 | 6/2019 | Kim et al. | |

FOREIGN PATENT DOCUMENTS

| | | | |
|---|---|---|---|
| CN | 107742480 | A | 2/2018 |
| CN | 108181752 | A | 6/2018 |
| CN | 110133956 | A | 8/2019 |
| CN | 111081158 | A | 4/2020 |
| CN | 111128051 | A | 5/2020 |
| CN | 210831162 | U | 6/2020 |
| CN | 111477119 | A | 7/2020 |
| CN | 111599284 | A | 8/2020 |
| CN | 111627966 | A | 9/2020 |
| CN | 111768716 | A | 10/2020 |
| CN | 111951697 | A | 11/2020 |
| CN | 111968537 | A | 11/2020 |
| CN | 112331090 | A | 2/2021 |
| CN | 212658917 | U | 3/2021 |

OTHER PUBLICATIONS

Name of the author: Juan Zhang, etc. Title of the article: A Scene Division Method for Overlapping Splicing in Multi-Channel Display Title of the item: «2012 Fourth International Conference on Digital Home» Date: Dec. 11, 2012 pp. P.52-P.56.

* cited by examiner

Forming a first adhesive layer on the second sub-surfaces of the sub-display panel, wherein the first adhesive layer comprises a plurality of first sub-adhesive portions, the first sub-adhesive portions cover the corresponding gaps, each of the first sub-adhesive portions connects two corresponding sub-display panels, and a width of each of the first sub-adhesive portions is greater than a width of the corresponding gap. — S401

Forming a second adhesive layer on the first adhesive layer, wherein the second adhesive layer at least covers an edge region of the display panel, and a material of the second adhesive layer is different from a material of the first adhesive layer. — S402

FIG. 6

SPLICING DISPLAY SCREEN AND MANUFACTURING METHOD THEREOF

RELATED APPLICATIONS

This application is a Notional Phase of PCT Patent Application No. PCT/CN2021/091272 having international filing date of Apr. 30, 2021, which claims the benefit of priority of Chinese Patent Application No. 202110408930.0 filed on Apr. 16, 2021. The contents of the above applications are all incorporated by reference as if fully set forth herein in their entirety.

FIELD OF INVENTION

The present application is related to the field of display technology and specifically to a splicing display screen and a manufacturing method thereof.

BACKGROUND OF INVENTION

Currently, in order to increase sizes of display screens to meet long-distance viewing or high-resolution requirements, most of the display screens are spliced together to display images.

Most current splicing methods are to match and assemble positioning holes on a back of each of display panels onto corresponding positioning posts on a bracket until all the display panels are installed on the bracket. However, due to differences in assembly tolerances and machining tolerances of the positioning holes, and thickness differences between the display panels, there are large gaps and large height differences between adjacent display panels in a splicing display screen, thereby reducing display quality of the splicing display screen.

In summary, it is necessary to provide a splicing display screen and a manufacturing method thereof that can reduce gaps and height differences to increase the display quality.

SUMMARY OF INVENTION

A purpose of the present application is to provide a splicing display screen and a manufacturing method thereof to solve a problem of a low display quality of the splicing display screen caused by a large gap and a height difference between two adjacent sub-display panels in a current splicing display screen.

An embodiment of the present application provides a splicing display screen, including:

a backplate;

a plurality of sub-display panels disposed on the backplate, wherein each of the sub-display panels includes a first sub-surface and a second sub-surface corresponding to each other, the first sub-surface is disposed on a side of one of the sub-display panels away from the backplate and is configured to display images; and an adhesive layer disposed between the backplate and the sub-display panels.

A plurality of the first sub-surfaces are positioned on a same plane. The sub-display panels are aligned to form a display panel. A gap is defined between two adjacent sub-display panels. The adhesive layer at least corresponds to a plurality of the gaps. The gap is not wider than 0.2 millimeters. Portions of the adhesive layer corresponding to the gaps are formed by a dispensing process.

The second sub-surface of each of the sub-display panels is provided with a circuit portion. The circuit portion is electrically connected to film layers in each of the sub-display panels through wires. The circuit portion is positioned at any one or more sides away from the corresponding gap.

In an embodiment, the adhesive layer includes a first adhesive layer including a plurality of first sub-adhesive portions. The first sub-adhesive portions correspond to the gaps. Each of the first sub-adhesive portions connects two corresponding sub-display panels. A width of each of the first sub-adhesive portions is greater than a width of the corresponding gap.

In an embodiment, the first adhesive layer is formed by the dispensing process.

In an embodiment, the adhesive layer further includes:

a second adhesive layer disposed on a side of the first adhesive layer adjacent to the backplate. The second adhesive layer at least corresponds to an edge region of the display panel. The second adhesive layer connects the sub-display panels and the backplate.

In an embodiment, the splicing display screen further includes:

a reinforcement layer disposed on a side of the adhesive layer adjacent to the backplate. The reinforcement layer at least corresponds to the adhesive layer. A material of the reinforcement layer includes metal.

In an embodiment, a side of the backplate away from the adhesive layer is defined with a positioning hole configured to fix the splicing display screen in place.

An embodiment of the present application provides a splicing display screen, including:

a backplate;

a plurality of sub-display panels disposed on the backplate, wherein each of the sub-display panels includes a first sub-surface, the first sub-surface is disposed on a side of one of the sub-display panels away from the backplate and is configured to display images; and an adhesive layer disposed between the backplate and the sub-display panels.

A plurality of the first sub-surfaces are positioned on a same plane. The sub-display panels are aligned to form a display panel. A gap is defined between two adjacent sub-display panels. The adhesive layer at least corresponds to a plurality of the gaps. The gap is not wider than 0.2 millimeters.

In an embodiment, the adhesive layer includes:

a first adhesive layer including a plurality of first sub-adhesive portions. The first sub-adhesive portions correspond to the gaps. Each of the first sub-adhesive portions connects two corresponding sub-display panels. A width of each of the first sub-adhesive portions is greater than a width of the corresponding gap.

In an embodiment, the first adhesive layer is formed by the dispensing process.

In an embodiment, the adhesive layer further includes:

a second adhesive layer disposed on a side of the first adhesive layer adjacent to the backplate. The second adhesive layer at least corresponds to an edge region of the display panel. The second adhesive layer connects the sub-display panels and the backplate.

In an embodiment, the splicing display screen further includes:

a reinforcement layer disposed on a side of the adhesive layer adjacent to the backplate. The reinforcement layer at least corresponds to the adhesive layer. A material of the reinforcement layer includes metal.

In an embodiment, a side of the backplate away from the adhesive layer is defined with a positioning hole configured to fix the splicing display screen in place.

In an embodiment, each of the sub-display panels further includes a second sub-surface corresponding to the first sub-surface and a circuit portion disposed on the second sub-surface.

The circuit portion is electrically connected to film layers in each of the sub-display panels through wires.

The circuit portion is positioned at any one or more sides away from the corresponding gap.

An embodiment of the present application provides a manufacturing method of a splicing display screen, including steps of:

providing a plurality of sub-display panels, wherein each of the sub-display panels includes a first sub-surface and a second sub-surface corresponding to each other, and the first sub-surface is configured to display images;

placing a plurality of the first sub-surfaces of the sub-display panels on a same plane;

aligning the sub-display panels to form a display panel, wherein a gap is defined between two adjacent sub-display panels;

forming an adhesive layer on a plurality of the second sub-surfaces of the sub-display panels to at least cover a plurality of the gaps, wherein the gap is not wider than 0.2 millimeters; and forming a backplate on the adhesive layer to cover the sub-display panels.

In an embodiment, the step of forming the adhesive layer on the second sub-surfaces of the sub-display panels to at least cover the gaps includes steps of:

forming a first adhesive layer on the second sub-surfaces of the sub-display panel, wherein the first adhesive layer includes a plurality of first sub-adhesive portions, the first sub-adhesive portions cover the corresponding gaps, each of the first sub-adhesive portions connects two corresponding sub-display panels, and a width of each of the first sub-adhesive portions is greater than a width of the corresponding gap; and forming a second adhesive layer on the first adhesive layer, wherein the second adhesive layer at least covers an edge region of the display panel, and a material of the second adhesive layer is different from a material of the first adhesive layer.

In an embodiment, before forming the backplate on the adhesive layer to cover the sub-display panels, further including a step of:

forming a reinforcement layer on the adhesive layer, wherein the reinforcement layer at least corresponds to the adhesive layer, and a material of the reinforcement layer includes metal.

The present application provides the splicing display screen and the manufacturing method thereof. The splicing display screen includes the backplate, the sub-display panels, and the adhesive layer. The present application disposes the sub-display panels on the backplate. Each of the sub-display panels includes the first sub-surface configured to display images. The present application disposes the first sub-surface on the side of one of the sub-display panels away from the backplate and arranges the first sub-surfaces on the same plane. Furthermore, the present application disposes the adhesive layer between the backplate and the sub-display panels. The adhesive layer at least corresponds to the gap between every two adjacent sub-display panels to connect every two adjacent sub-display panels. Also, the sub-display panels are fixed on the backplate. As a result, the gap and a height difference between two adjacent sub-display panels can be reduced. Eventually, the gap can be not wider than 0.2 millimeters, and the height difference can be not greater than 0.2 millimeters, thereby achieving a seamless viewing effect and increasing the display quality of the splicing display screen.

DESCRIPTION OF DRAWINGS

The following describes specific embodiments of the present application in detail with reference to the accompanying drawings, which will make technical solutions and other beneficial effects of the present application obvious.

FIG. 6 is another flowchart of the manufacturing method of the splicing display screen provided by an embodiment of the present application.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application. "Embodiment" mentioned herein means that particular features, structures, or characteristic described with reference thereto may be included in at least one implementation of the present application. Appearances of such phrases in various places of the specification do not necessarily refer to the same implementation, nor refer to separate or alternative implementations that are mutually exclusive with other implementations. It is explicitly and implicitly understood by those skilled in the art that the implementations described herein may be combined with other implementations. In addition, it should be noted that the drawings only provide structures that are closely related to the present application, and some details that are not related to the present application are omitted. The purpose is to simplify the drawings and make the present application clear at a glance, instead of showing that a device in reality is exactly same as the drawings, and is not a limitation of the device in reality.

The present application provides a splicing display screen. The splicing display screen includes, but is not limited to, the following embodiments and a combination of the following embodiments.

Figure 1:
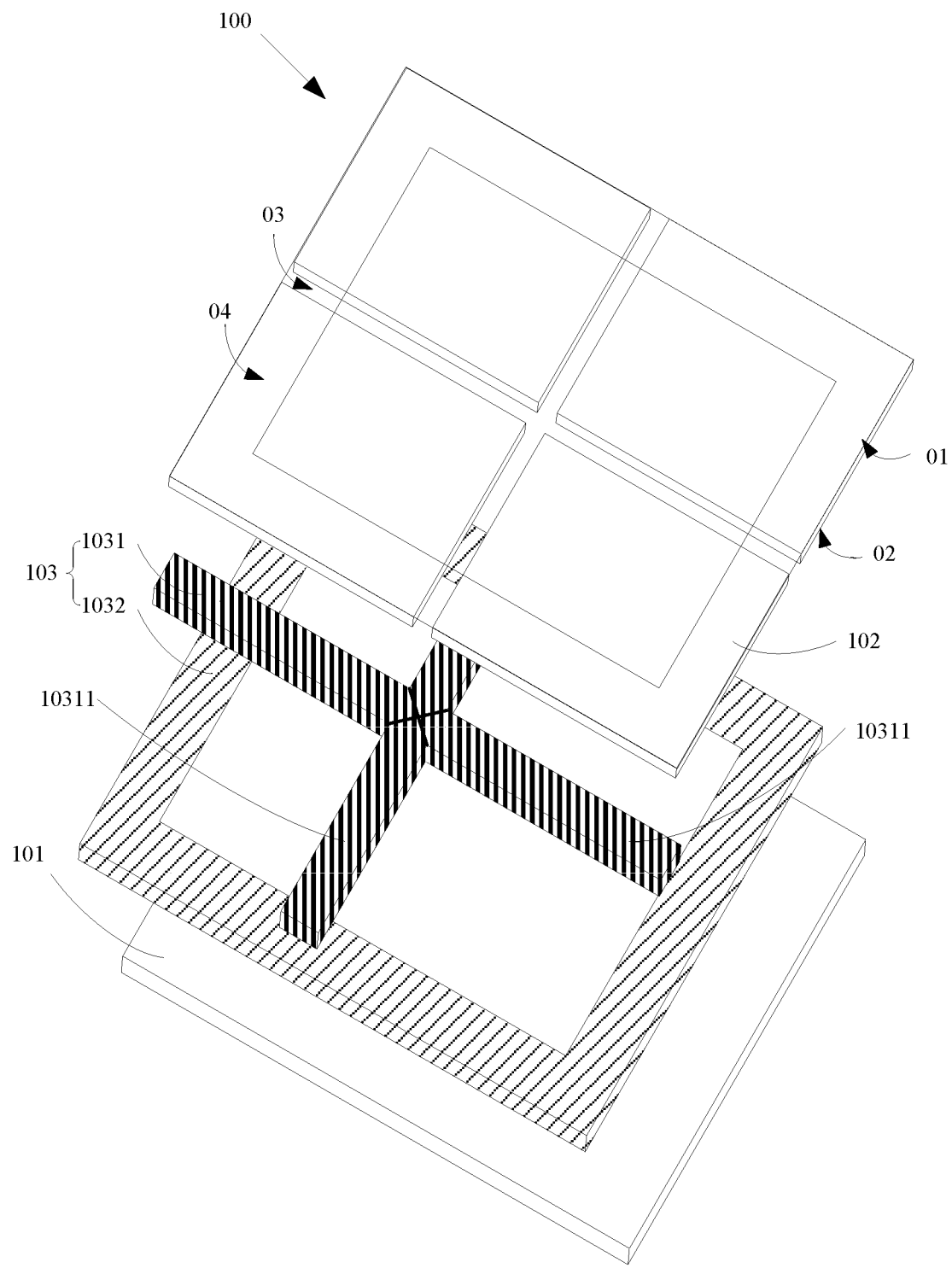
FIG. 1 is a schematic diagram of an exploded view of a splicing display screen provided by an embodiment of the present application.
Figure 2:
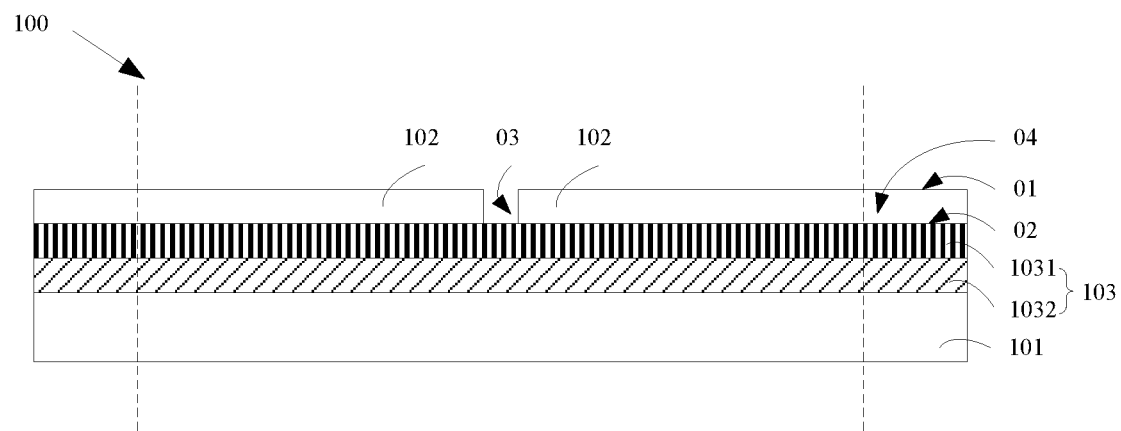
FIG. 2 is a schematic diagram of a cross-sectional view of the splicing display screen provided by an embodiment of the present application.

In an embodiment, as shown in FIGS. 1 and 2, the splicing display screen 100 includes: a backplate 101; a plurality of sub-display panels 102 disposed on the backplate 101, wherein each of the sub-display panels 102 includes a first sub-surface 01 disposed on a side of one of the sub-display panels 102 away from the backplate 101 and is configured to display images; and an adhesive layer 103 disposed between the backplate 101 and the sub-display panels 102. A plurality of the first sub-surfaces 01 are positioned on a same plane. The sub-display panels 102 are aligned to form a display panel. A gap 03 is defined between two adjacent sub-display panels 102. The adhesive layer 103 at least corresponds to a plurality of the gaps 03. The gap is not wider than 0.2 millimeters.

The sub-display panels 102 can be, but are not limited to, micro light-emitting diode (micro LED) display panels. In other words, the sub-display panels 201 can adopt a form of integrating high-density and small-size LED arrays and display images through self-luminescence. It should be noted that the first sub-surface 01 of each of the sub-display panels 102 can be faced toward a platform to place the sub-display panels 102 on the platform. A surface of the platform facing the sub-display panels 102 can be smooth and continuous, so that the first sub-surfaces 01 are positioned on the same plane. The platform can be, but is not limited to, a marble platform or a glass platform that can better conform to the first sub-surfaces 01. Furthermore, the surface of the platform facing the sub-display panels 102 can be parallel to a horizontal plane, so as to reduce a contact difference between the sub-display panels 102 and the platform, and also facilitate a subsequent process of the sub-display panels 102. It should be noted that facing the first sub-surface 01 of each of the sub-display panels 102 toward the platform not only can place the sub-display panels 102 on the platform, but can also achieve positioning the first sub-surfaces 01 on the same plane. Therefore, the first sub-surfaces 01 of the sub-display panels 102 can achieve no height difference, thereby increasing display quality of the splicing display screen 100.

Figure 3:
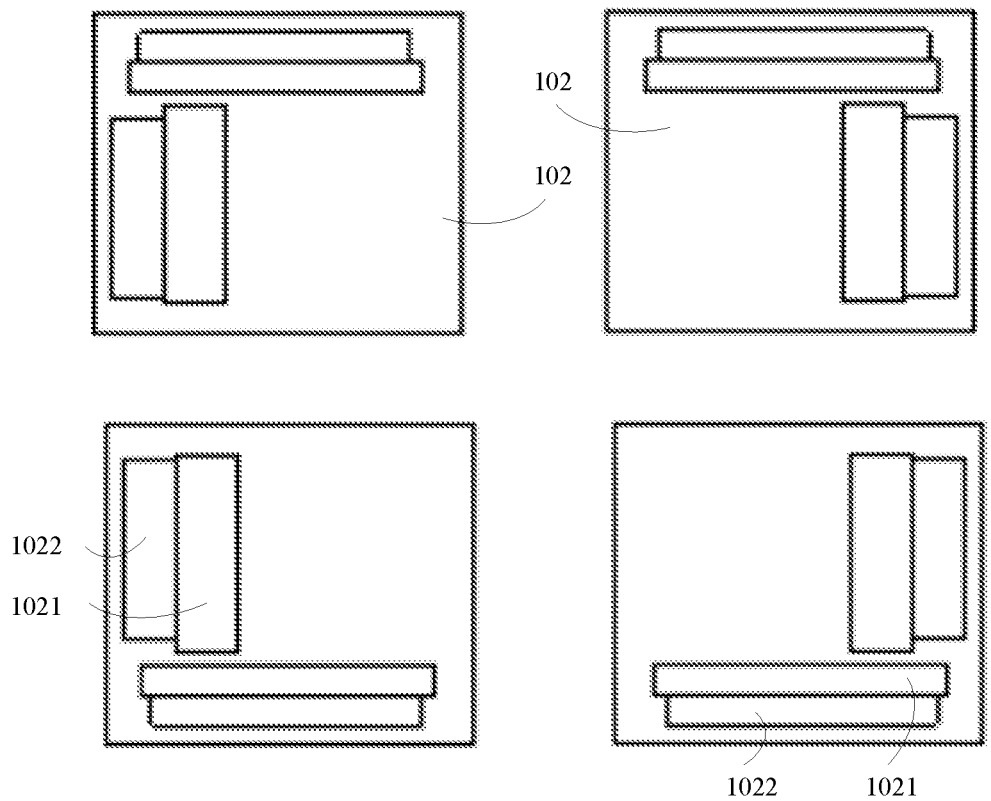
FIG. 3 is a schematic diagram of splicing the splicing display screen provided by an embodiment of the present application.

In an embodiment, as shown in FIGS. 1-3, each of the sub-display panels 102 further includes a second sub-surface 02 corresponding to the first sub-surface 01. Each of the sub-display panels 102 includes a circuit portion. The circuit portion is disposed on the second sub-surface 02. The circuit portion is electrically connected to film layers in each of the sub-display panels 102 through wires. The circuit portion is positioned at any one or more sides away from the corresponding gap 03. Specifically, as shown in FIG. 3, each of the sub-display panels 102 can include at least a group of circuit portions. Each group of the circuit portion can include a printed circuit board 1021 and a thin-film flip-chip 1022. The thin-film flip-chip 1022 is disposed on a side of the printed circuit board 1021 adjacent to an edge of each of the sub-display panels 102. The thin-film flip-chip 1022 is electrically connected to the wires to electrically connect the printed circuit board 1021 and the corresponding film layers in each of the sub-display panels 102.

It should be noted that because the wires need to be connected to the corresponding film layers in each of the sub-display panels 102 through a side of each of the sub-display panels 102, the adhesive layer 103 corresponding to the gaps 03 may cover the wires and cause the wires to fail. Specifically, when the display panel includes the sub-display panels 102 arranged in two columns or two rows, and each of the sub-display panels 102 includes a group of the circuit portions, a plurality of groups of the circuit portions can be arranged in regions adjacent to two long sides of the display panel. Specifically, as shown in FIG. 3, when the display panel includes four sub-display panels 102 arranged in a 2*2 matrix, and the circuit portion includes two groups of the circuit portions, the two groups of circuit portions in each of the sub-display panels 102 can be respectively arranged in regions adjacent to the other two sides that are different from two sides of two corresponding gaps 03. It can be understood that the above-mentioned embodiment can effectively prevent the adhesive layer 103 from covering the wires and reduce risk of failure of the wires.

Specifically, a number of the sub-display panels 102 can be an odd number or an even number. When the number of the sub-display panels 102 is an odd number, the sub-display panels 102 can be arranged in a same direction, or the sub-display panels 102 can be arranged in other shapes. When the number of the sub-display panels 102 is an even number, the sub-display panels 102 can be arranged in a same direction, the sub-display panels 102 can be arranged in a rectangular shape, or the sub-display panels 102 can be arranged in other shapes. It should be noted that alignments of the sub-display panels 102 can be understood as that the gaps 03 between any two adjacent sub-display panels 102 are equal regardless of the number and arrangement of the sub-display panels 102. The gap 03 can represent a distance between two adjacent sides of two corresponding adjacent sub-display panels 102, which means that the distance between the two adjacent sides of the two adjacent sub-display panels 102 can be equal everywhere.

Specifically, the sub-display panels 102 can be placed according to a preset shape, and a larger gap occurs between two adjacent sub-display panels 102 at this moment. Furthermore, the placed sub-display panels 102 can be squeezed into a seamless state by humans or mechanical arms. The seamless state refers to a state that there is the gap 03 between two adjacent sub-display panels 102. Furthermore, at least one side of a shape formed by the sub-display panels 102 can be fixed and maintained by auxiliary fixing strips, so as to prevent the shape formed by the sub-display panels 102 from changing, thereby facilitate a subsequent process of the sub-display panels 102. It should be noted that the gap in the splicing display screen in this embodiment can be not wider than 0.2 millimeters. It can be understood that the smaller a size of the gap 03, the better. The gap 03 can prevent reducing the display quality of the splicing display screen 100.

In an embodiment, as shown in FIGS. 1 and 2, the adhesive layer 103 includes a first adhesive layer 1031. The first adhesive layer 1031 includes a plurality of first sub-adhesive portions 10311. The first sub-adhesive portions 10311 correspond to the gaps 03. Each of the first sub-adhesive portions 10311 connects two corresponding sub-display panels 102. A width of each of the first sub-adhesive portions 10311 is greater than a width of the corresponding gap 03. It can be understood that the sub-display panels 102 are aligned to form the display panel. The display panel includes a first surface and a second surface corresponding to each other. The first surface includes the first sub-surfaces 01 and a plurality of surfaces of the gaps 03 adjacent to the first sub-surfaces 01. The second surface includes a plurality of the second sub-surfaces 02 and a plurality of surfaces of the gaps 03 adjacent to the second sub-surfaces 02. Specifically, the width of each of the first sub-adhesive portions 10311 is greater than the width of the corresponding gap 03 can be understood that each of the first sub-adhesive portions 10311 is not only positioned on surfaces of two corresponding second sub-surfaces 02 in the corresponding gap 03, but also extend to the two corresponding second sub-surfaces 02 to connect the two corresponding sub-display panels 102.

In an embodiment, the first adhesive layer 1031 is formed by a dispensing process. It can be understood that when the sub-display panels 102 are in the seamless state, the dispensing process with liquid glue can be applied multiple times along multiple paths to form the first sub-adhesive portions 10311. Compared with using a double-sided tape or other solid glue to process the second surface, the dispensing process can reduce a force on the sub-display panels 102 and reduce risk of displacement of the sub-display panels 102. Furthermore, as shown in FIG. 1, when extension lines of part of the gaps 03 overlap, part of the gaps 03 can be formed by the dispensing process along a corresponding path. At least two first sub-adhesive portions 10311 separated by part of the gap 03 can be separately formed by the dispensing process. Any two connected first sub-adhesive portions 10311 can be further prevent from overlapping, thereby preventing the first adhesive layer 1031 adjacent to overlapping portions from being broken.

In an embodiment, the first adhesive layer 1031 is made of glue. According to the above-mentioned analysis, the first adhesive layer 1031 should be viscous and needs to be formed by the dispensing process. The first adhesive layer 1031 can be made of a liquid viscous material including, but not limited to the glue. The glue can also be understood as a non-liquid viscous material. Furthermore, the glue can be converted into a liquid viscous material and added to which includes, but is not limited to, a dispenser to be dripped or coated on the second surface of the display panel. Specifically, a material of the glue can be, but is not limited to, UV glue, peelable blue glue, and fluorinated liquid. Furthermore, after the dispensing process drips or coats a corresponding material on the second surface of the display panel, the material on the second surface is processed by UV light irradiation or natural air drying to form the material on the second surface.

In an embodiment, as shown in FIGS. 1 and 2, the sub-display panels 102 are aligned to form the display panel. The adhesive layer 103 further includes a second adhesive layer 1032. The second adhesive layer 1032 is disposed on a side of the first adhesive layer 1031 adjacent to the backplate 101. The second adhesive layer 1032 at least corresponds to an edge region 04 of the display panel. The second adhesive layer 1032 connects the sub-display panels 102 and the backplate 101. The edge region 04 can be a region extending inward with edges of the display panel as an outer boundary, and a width of the edge region 04 is not limited herein. It can be understood that the second adhesive layer 1032 can correspond to the edge region 04 of the display panel, so that edges of the backplate 101 and the edges of the display panel can be attached to and fix with each other, thereby preventing wasting materials and increasing an adhesion yield. Furthermore, because the second adhesive layer 1032 needs to be adjacent to the edges of the display panel, the second adhesive layer 1032 can be formed by solid glue instead of the dispensing process, so as to prevent liquid materials from flowing into the first surface of the display panel.

A material of the second adhesive layer 1032 can different from a material of the first adhesive layer 1031. Furthermore, the second adhesive layer 1032 can be the double-sided tape. It can be understood that because the double-sided tape has a fixed shape at room temperature, the double-sided tape can be directly attached to the second surface of the display panel in a region corresponding to the edge region 04 to form the second adhesive layer 1032. Specifically, the double-sided tape can include two adhesive layers corresponding to each other and a buffer layer disposed between the two adhesive layers, one of the adhesive layers attaches the display panel to the buffer layer, and the other one of the adhesive layers attaches the backplate to the buffer layer. A material of the buffer layer can be, but is not limited to, an elastic material. For example, the double-sided tape can be, but is not limited to, a double-sided foam tape. It can be understood that because the second adhesive layer 1032 is formed after the first adhesive layer 1031, the second adhesive layer 1032 can further cover part of the first adhesive layer 1031.

In an embodiment, as shown in FIG. 1 and FIG. 2, the splicing display screen 100 further includes a reinforcement layer. The reinforcement layer is disposed on the side of the adhesive layer 103 adjacent to the backplate 101. The reinforcement layer at least corresponds to the adhesive layer 102. A material of the reinforcement layer includes metal. It can be understood that the reinforcement layer can further support the adhesive layer 103 to reduce risk of breaking or detaching of the adhesive layer 103. The display panel generally needs to be placed vertically for displaying images. When there is a large number of the sub-display panels 102 contained in the display panel, gravity may cause the sub-display panels 102 in upper layers to compress the sub-display panels 102 in lower layers. The display panels 102 to loosen the display panel. However, the reinforcement layer can increase vertical friction forces of the sub-display panels 102, thereby reducing the above-mentioned risks. Furthermore, the reinforcement layer can be made of metal to increase a strength of the reinforcement layer and further increase a supporting effect of the reinforcement layer. The reinforcement layer can at least cover the first adhesive layer 1031. Furthermore, the reinforcement layer can further cover the second adhesive layer 1032. Moreover, the reinforcement layer can cover the second surface of the display panel.

In an embodiment, a side of the backplate 101 away from the adhesive layer 103 is defined with a positioning hole. The positioning hole is configured to fix the splicing display screen 100 in place. It can be understood that when processes of the splicing display screen 100 are completed, the splicing display screen 100 needs to be fixed on the bracket to display images. A side of the backplate 101 away from the adhesive layer 103 can be defined with at least one positioning hole. Specifically, this can include, but is not limited to, the following examples. When one positioning hole is defined on the side of the backplate 101 away from the adhesive layer 103, the positioning hole can be defined in a middle region of the backplate 101. When two positioning holes are defined on the side of the backplate 101 away from the adhesive layer 103, the two positioning holes can be respectively defined at two corner regions on a diagonal line of the backplate 101. When four positioning holes are defined on the side of the backplate 101 away from the adhesive layer 103, the four positioning holes can be respectively defined at four corner regions of the backplate 101. It can be understood that on a basis that the first sub-surfaces 01 are positioned on the same plane, sequentially disposing the adhesive layer 103 and the backplate 101 on the sub-display panels 102 can prevent the sub-display panels 102 from being fixed on the bracket. In this way, assembly tolerances can be eliminated, and the sub-display panels 102 can be directly fixed on the bracket through the backplate 101 carrying the sub-display panels 102. During a process of fixing the display panel on the bracket, the widths of the gaps 03 are not further increased.

The present application further provides a manufacturing method of the splicing display screen. The manufacturing method of the splicing display screen includes, but is not limited to, the following embodiments and a combination of the following embodiments.

Figure 4:
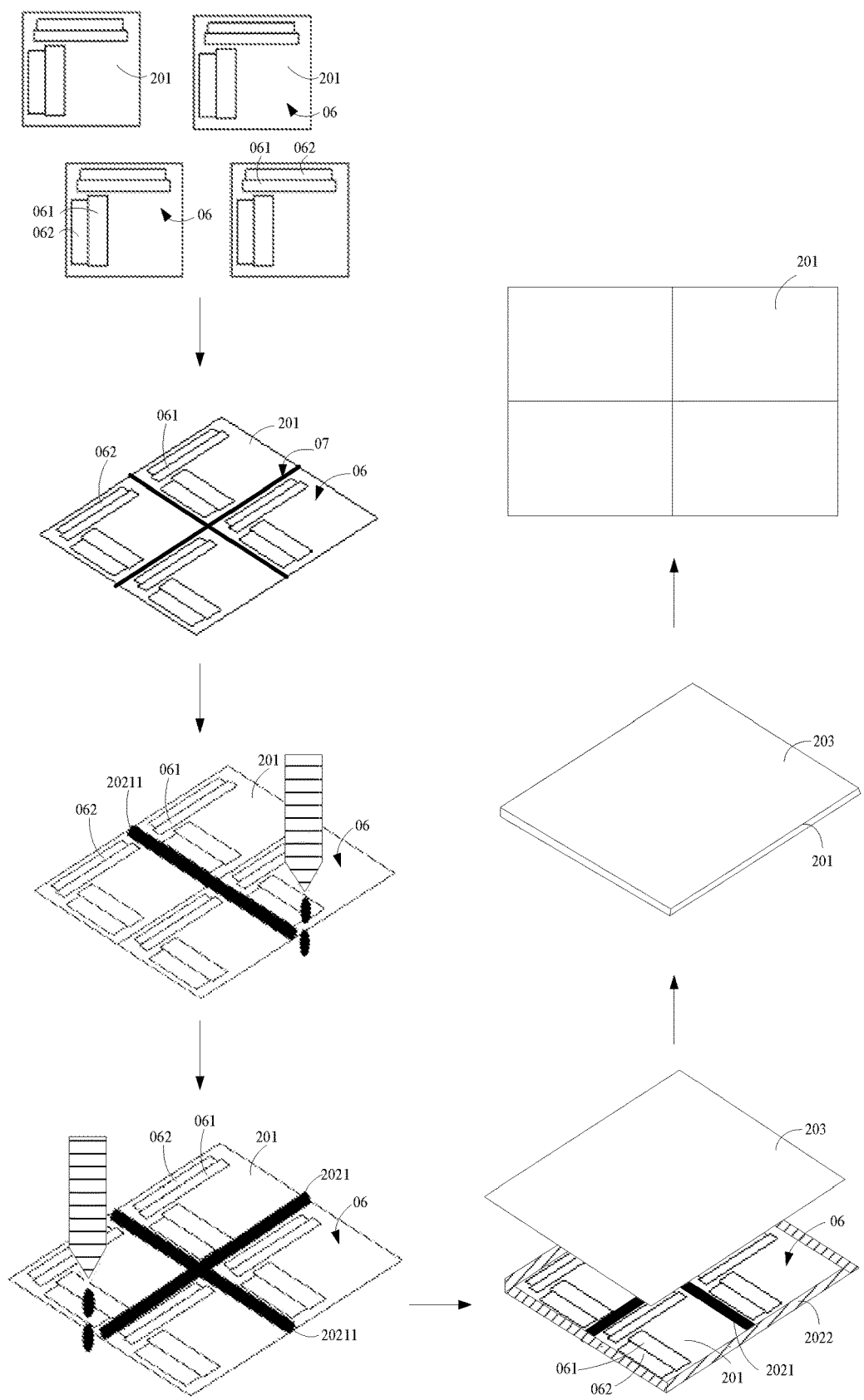
FIG. 4 is a schematic diagram of scenes of a manufacturing method of the splicing display screen provided by an embodiment of the present application.
Figure 5:
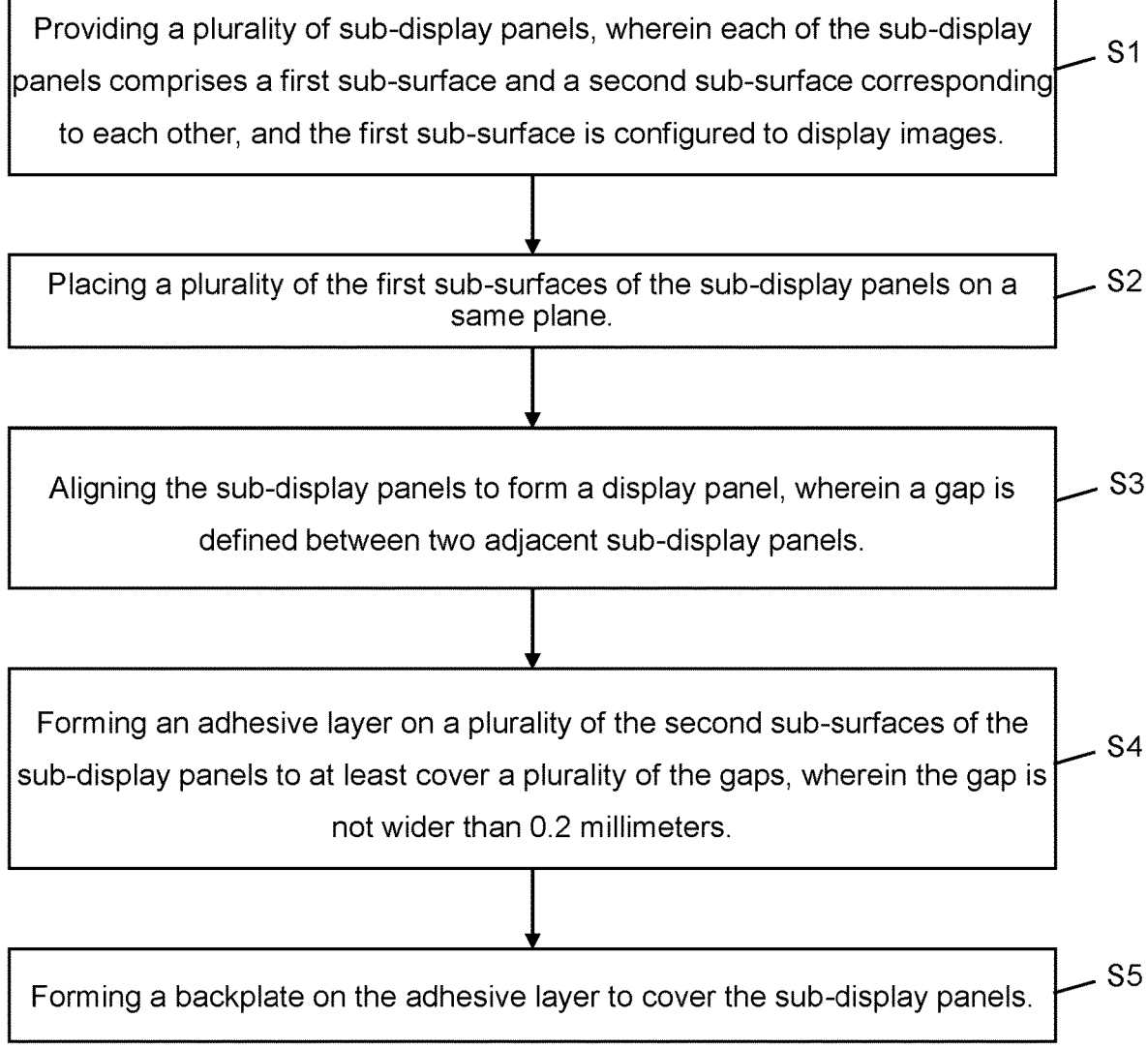
FIG. 5 is a flowchart of the manufacturing method of the splicing display screen provided by an embodiment of the present application.

In an embodiment, as shown in FIGS. 4 and 5, the manufacturing method of the splicing display screen includes, but is not limited to, the following steps.

S1, providing a plurality of sub-display panels 201. Each of the sub-display panels 201 includes a first sub-surface 05 and a second sub-surface 06 corresponding to each other. The first sub-surface 05 is configured to display images.

The sub-display panels 201 can be, but are not limited to, micro light-emitting diode (micro LED) display panels. In other words, the sub-display panels 201 can adopt a form of integrating high-density and small-size LED arrays, and display images through self-luminescence.

Each of the sub-display panels 201 can include a printed circuit board 061 and a thin-film flip-chip 062. The thin-film flip-chip 062 is disposed on a side of the printed circuit board 061 adjacent to an edge of each of the sub-display panels 201. The thin-film flip-chip 062 is connected to the printed circuit board 061 and corresponding film layers in each of the sub-display panels 201. Furthermore, the second sub-surface 06 of each of the sub-display panels 201 can be provided with two printed circuit boards 061 and two thin-film flip-chips 062.

S2, placing a plurality of the first sub-surfaces 05 of the sub-display panels 201 on a same plane.

It should be noted that the first sub-surface 05 of each of the sub-display panels 201 can be faced toward a platform to place the sub-display panels 201 on the platform. A surface of the platform facing the sub-display panels 201 can be smooth and continuous, so that the first sub-surfaces 05 are positioned on the same plane. The platform can be, but is not limited to, a marble platform or a glass platform that can better conform to the first sub-surfaces 05. Furthermore, the surface of the platform facing the sub-display panels 201 can be parallel to a horizontal plane, so as to reduce a contact difference between the sub-display panels 201 and the platform, and also facilitate a subsequent process of the sub-display panels 201. It should be noted that facing the first sub-surface 05 of each of the sub-display panels 201 toward the platform not only can place the sub-display panels 201 on the platform, but can also achieve positioning the first sub-surfaces 05 on the same plane. Therefore, the first sub-surfaces 05 of the sub-display panels 201 can achieve no height difference, thereby increasing display quality of the splicing display screen.

S3, aligning the sub-display panels 201 to form a display panel. A gap 07 is defined between two adjacent sub-display panels 201. The gap 07 is not wider than 0.2 millimeters.

Specifically, a number of the sub-display panels 201 can be an odd number or an even number. When the number of the sub-display panels 201 is an odd number, the sub-display panels 201 can be arranged in a same direction, or the sub-display panels 201 can be arranged in other shapes. When the number of the sub-display panels 201 is an even number, the sub-display panels 201 can be arranged in a same direction, the sub-display panels 201 can be arranged in a rectangular shape, or the sub-display panels 201 can be arranged in other shapes. It should be noted that alignments of the sub-display panels 201 can be understood as that the gaps 07 between any two adjacent sub-display panels 201 are equal regardless of the number and arrangement of the sub-display panels 201. The gap 07 can represent a distance between two adjacent sides of two corresponding adjacent sub-display panels 201, which means that the distance between the two adjacent sides of the two adjacent sub-display panels 201 can be equal everywhere.

It can be understood that the smaller a size of the gap 07, the better. The gap 07 can prevent reducing the display quality of the splicing display screen. Specifically, the sub-display panels 201 can be placed according to a preset shape, and a larger gap occurs between two adjacent sub-display panels 201 at this moment. Furthermore, the placed sub-display panels 201 can be squeezed into a seamless state by humans or mechanical arms. The seamless state refers to a state that there is the gap 07 between two adjacent sub-display panels 201. Furthermore, at least one side of a shape formed by the sub-display panels 201 can be fixed and maintained by auxiliary fixing strips, so as to prevent the shape formed by the sub-display panels 102 from changing, thereby facilitate a subsequent process of the sub-display panels 102.

S4, forming an adhesive layer on a plurality of the second sub-surfaces 06 of the sub-display panels 201. The adhesive layer at least covers a plurality of the gaps 07.

In an embodiment, as shown in FIGS. 4 and 6, step S4 includes, but is not limited to, the following steps.

S401, forming a first adhesive layer 2021 on the second sub-surfaces 06 of the sub-display panels 201. The first adhesive layer 2021 includes a plurality of first sub-adhesive portions 20211. The first sub-adhesive portions 20211 cover the gaps 07. Each of the first sub-adhesive portions 20211 connects two corresponding sub-display panels 201. A width of each of the first sub-adhesive portions 20211 is greater than a width of the corresponding gap 07.

It can be understood that the sub-display panels 201 are aligned to form the display panel. The display panel includes a first surface and a second surface corresponding to each other. The first surface includes the first sub-surfaces 05 and a plurality of surfaces of the gaps 07 adjacent to the first sub-surfaces 05. The second surface includes the second sub-surfaces 06 and a plurality of surfaces of the gaps 07 adjacent to the second sub-surfaces 06. Specifically, the width of each of the first sub-adhesive portions 20211 is greater than the width of the corresponding gap 07 can be understood that each of the first sub-adhesive portions 20211 is not only positioned on surfaces of two corresponding second sub-surfaces 06 in the corresponding gap 07, but also extend to the two corresponding second sub-surfaces 06 to connect the two corresponding sub-display panels 201.

The first adhesive layer 2021 is formed by a dispensing process, which can be specifically referred to the above-mentioned relevant description. The first adhesive layer 2021 is formed by glue, which can be specifically referred to the above-mentioned relevant description.

S402, forming a second adhesive layer 2022 on the first adhesive layer 2021. The second adhesive layer 2022 at least covers an edge region of the display panel. A material of the second adhesive layer 2022 is different from a material of the first adhesive layer 2021.

The edge region can be a region extending inward with edges of the display panel as an outer boundary, and a width of the edge region is not limited herein. Furthermore, the second adhesive layer 2022 can be a double-sided tape, which can be specifically referred to the above-mentioned relevant description.

S5, forming a backplate 203 on the adhesive layer. The backplate 203 covers the sub-display panels 201.

It can be understood that the second adhesive layer 2022 can correspond to the edge region of the display panel, so that edges of the backplate 203 and the edges of the display panel can be attached to and fix with each other, thereby preventing wasting materials and increasing an adhesion yield. Furthermore, because the second adhesive layer 2022 needs to be adjacent to the edges of the display panel, the second adhesive layer 2022 can be formed by solid glue instead of the dispensing process, so as to prevent liquid materials from flowing into the first surface of the display panel.

In an embodiment, a side of the backplate 203 away from the adhesive layer is defined with a positioning hole. The positioning hole is configured to fix the splicing display screen onto the bracket. It can be understood that when processes of the splicing display screen are completed, the splicing display screen needs to be fixed on the bracket to display images. A side of the backplate 203 away from the adhesive layer can be defined with at least one positioning hole. Specifically, this can include, but is not limited to, the following examples. When one positioning hole is defined on the side of the backplate 203 away from the adhesive layer, the positioning hole can be defined in a middle region of the backplate 203. When two positioning holes are defined on the side of the backplate 203 away from the adhesive layer, the two positioning holes can be respectively defined at two corner regions on a diagonal line of the backplate 203. When four positioning holes are defined on the side of the backplate 203 away from the adhesive layer, the four positioning holes can be respectively defined at four corner regions of the backplate 203. It can be understood that on a basis that the first sub-surfaces 05 are positioned on the same plane, sequentially disposing the adhesive layer and the backplate 203 on the sub-display panels 201 can prevent the sub-display panels 201 from being fixed on the bracket. In this way, assembly tolerances can be eliminated, and the sub-display panels 201 can be directly fixed on the bracket through the backplate 203 carrying the sub-display panels 201. During a process of fixing the display panel on the bracket, the widths of the gaps 07 are not further increased.

In an embodiment, before step S5, the manufacturing method includes, but is not limited to, a step of forming a reinforcement layer on the adhesive layer. The reinforcement layer at least corresponds to the adhesive layer. A material of the reinforcement layer includes metal.

It can be understood that the reinforcement layer can further support the adhesive layer to reduce risk of breaking or detaching of the adhesive layer. The display panel generally needs to be placed vertically for displaying images. When there is a large number of the sub-display panels 201 contained in the display panel, gravity may cause the sub-display panels 201 in upper layers to compress the sub-display panels 102 in lower layers. The display panels 201 to loosen the display panel. However, the reinforcement layer can increase vertical friction forces of the sub-display panels 201, thereby reducing the above-mentioned risks. Furthermore, the reinforcement layer can be made of metal to increase a strength of the reinforcement layer and further increase a supporting effect of the reinforcement layer. The reinforcement layer can at least cover the first adhesive layer 2021. Furthermore, the reinforcement layer can further cover the second adhesive layer 2022. Moreover, the reinforcement layer can cover the second surface of the display panel.

The present application provides the splicing display screen and the manufacturing method thereof. The splicing display screen includes the backplate, the sub-display panels, and the adhesive layer. The present application disposes the sub-display panels on the backplate. Each of the sub-display panels includes the first sub-surface configured to display images. The present application disposes the first sub-surface on the side of one of the sub-display panels away from the backplate and arranges the first sub-surfaces on the same plane. Furthermore, the present application disposes the adhesive layer between the backplate and the sub-display panels. The adhesive layer at least corresponds to the gap between every two adjacent sub-display panels to connect every two adjacent sub-display panels. Also, the sub-display panels are fixed on the backplate. As a result, the gap and the height difference between two adjacent sub-display panels can be reduced. Eventually, the gap can be not wider than 0.2 millimeters, and the height difference can be not greater than 0.2 millimeters, thereby achieving a seamless viewing effect and increasing the display quality of the splicing display screen.

The splicing display screen and the manufacturing method thereof provided by embodiments of the present application are described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A splicing display screen, comprising:
   a backplate;
   a plurality of sub-display panels disposed on the backplate, wherein each of the sub-display panels comprises a first sub-surface and a second sub-surface corresponding to each other, the first sub-surface is disposed on a side of one of the sub-display panels away from the backplate and is configured to display images; and
   an adhesive layer disposed between the backplate and the sub-display panels;
   wherein a plurality of the first sub-surfaces are disposed on a same plane, the sub-display panels are aligned to form a display panel, a gap is defined between two adjacent sub-display panels, the adhesive layer at least corresponds to a plurality of the gaps, the gap is not wider than 0.2 millimeters, and portions of the adhesive layer corresponding to the gaps are formed by a dispensing process;
   wherein the second sub-surface of each of the sub-display panels is provided with a circuit portion, the circuit portion is electrically connected to film layers in each of the sub-display panels through wires, and the circuit portion is positioned at any one or more sides away from the corresponding gap;
   wherein the adhesive layer comprises a first adhesive layer comprising a plurality of first sub-adhesive portions, the first sub-adhesive portions correspond to the gaps, each of the first sub-adhesive portions connects two corresponding sub-display panels, and a width of each of the first sub-adhesive portions is greater than a width of the corresponding gap;
   wherein the adhesive layer further comprises a second adhesive layer disposed on a side of the first adhesive layer adjacent to the backplate, the second adhesive layer at least corresponds to an edge region of the display panel, and the second adhesive layer connects the sub-display panels and the backplate; and
   wherein the second adhesive layer at least covers an edge region of the display panel, and a material of the second adhesive layer is different from a material of the first adhesive layer.

2. The splicing display screen according to claim 1, wherein the first adhesive layer is formed by the dispensing process.

3. The splicing display screen according to claim 1, further comprising a reinforcement layer disposed on a side of the adhesive layer adjacent to the backplate, wherein the reinforcement layer at least corresponds to the adhesive layer, and a material of the reinforcement layer comprises metal.

4. The splicing display screen according to claim 1, wherein a side of the backplate away from the adhesive layer is defined with a positioning hole configured to fix the splicing display screen in place.

5. A splicing display screen, comprising:
a backplate;
a plurality of sub-display panels disposed on the backplate, wherein each of the sub-display panels comprises a first sub-surface, the first sub-surface is disposed on a side of one of the sub-display panels away from the backplate and is configured to display images; and
an adhesive layer disposed between the backplate and the sub-display panels;
wherein a plurality of the first sub-surfaces are disposed on a same plane, the sub- display panels are aligned to form a display panel, a gap is defined between two adjacent sub-display panels, the adhesive layer at least corresponds to a plurality of the gaps, and the gap is not wider than 0.2 millimeters;
wherein the adhesive layer comprises a first adhesive layer comprising a plurality of first sub-adhesive portions, the first sub-adhesive portions correspond to the gaps, each of the first sub-adhesive portions connects two corresponding sub-display panels, and a width of each of the first sub-adhesive portions is greater than a width of the corresponding gap;
wherein the adhesive layer further comprises a second adhesive layer disposed on a side of the first adhesive layer adjacent to the backplate, the second adhesive layer at least corresponds to an edge region of the display panel, and the second adhesive layer connects the sub-display panels and the backplate; and
wherein the second adhesive layer at least covers an edge region of the display panel, and a material of the second adhesive layer is different from a material of the first adhesive layer.

6. The splicing display screen according to claim 5, wherein the first adhesive layer is formed by the dispensing process.

7. The splicing display screen according to claim 5, further comprising a reinforcement layer disposed on a side of the adhesive layer adjacent to the backplate, wherein the reinforcement layer at least corresponds to the adhesive layer, and a material of the reinforcement layer comprises metal.

8. The splicing display screen according to claim 5, wherein a side of the backplate away from the adhesive layer is defined with a positioning hole configured to fix the splicing display screen in place.

9. The splicing display screen according to claim 5, wherein each of the sub-display panels further comprises a second sub-surface corresponding to the first sub-surface and a circuit portion disposed on the second sub-surface; and
the circuit portion is electrically connected to film layers in each of the sub-display panels through wires, and the circuit portion is positioned at any one or more sides away from the corresponding gap.

10. A manufacturing method of a splicing display screen, comprising steps of:
providing a plurality of sub-display panels, wherein each of the sub-display panels comprises a first sub-surface and a second sub-surface corresponding to each other, and the first sub-surface is configured to display images;
placing a plurality of the first sub-surfaces of the sub-display panels on a same plane;
aligning the sub-display panels to form a display panel, wherein a gap is defined between two adjacent sub-display panels;
forming an adhesive layer on a plurality of the second sub-surfaces of the sub-display panels to at least cover a plurality of the gaps, wherein the gap is not wider than 0.2 millimeters; and
forming a backplate on the adhesive layer to cover the sub-display panels;
wherein the step of forming the adhesive layer on the second sub-surfaces of the sub-display panels to at least cover the gaps comprises steps of:
forming a first adhesive layer on the second sub-surfaces of the sub-display panel, wherein the first adhesive layer comprises a plurality of first sub-adhesive portions, the first sub-adhesive portions cover the corresponding gaps, each of the first sub-adhesive portions connects two corresponding sub-display panels, and a width of each of the first sub-adhesive portions is greater than a width of the corresponding gap; and
forming a second adhesive layer on the first adhesive layer, wherein the second adhesive layer at least covers an edge region of the display panel, and a material of the second adhesive layer is different from a material of the first adhesive layer.

11. The manufacturing method of the splicing display screen according to claim 10, before forming the backplate on the adhesive layer to cover the sub-display panels, further comprising a step of:
forming a reinforcement layer on the adhesive layer, wherein the reinforcement layer at least corresponds to the adhesive layer, and a material of the reinforcement layer comprises metal.

\* \* \* \* \*